United States Patent
Baik et al.

(10) Patent No.: US 7,486,018 B2
(45) Date of Patent: Feb. 3, 2009

(54) ORGANIC ELECTRO-LUMINESCENCE DISPLAY DEVICE AND FABRICATING METHOD THEREOF

(75) Inventors: Kwang Heum Baik, Gyeongsangbuk-do (KR); Do Young Kum, Daegu (KR); Ki Hong Kim, Gyeongsangbuk-do (KR); Jung Hwan Lee, Daegu (KR)

(73) Assignee: LG Electronics Inc., Seoul (KR)

( * ) Notice: Subject to any disclaimer, the term of this patent is extended or adjusted under 35 U.S.C. 154(b) by 314 days.

(21) Appl. No.: 11/220,650

(22) Filed: Sep. 8, 2005

(65) Prior Publication Data

US 2006/0055317 A1 Mar. 16, 2006

(30) Foreign Application Priority Data

Sep. 9, 2004 (KR) .................. 10-2004-0072138

(51) Int. Cl.
*H01J 1/62* (2006.01)
*H01J 63/04* (2006.01)
(52) U.S. Cl. ...................... 313/506; 313/509
(58) Field of Classification Search ............ 313/504, 313/506, 509; 445/24, 25
See application file for complete search history.

(56) References Cited

U.S. PATENT DOCUMENTS

2003/0030766 A1* 2/2003 Kiguchi et al. ............. 349/106
2003/0080678 A1* 5/2003 Kim et al. .................. 313/504
2004/0124770 A1* 7/2004 Hayashi et al. ............. 313/506

FOREIGN PATENT DOCUMENTS

KR 10-2003-0079429 A 10/2003

* cited by examiner

*Primary Examiner*—Nimeshkumar D. Patel
*Assistant Examiner*—Anthony T Perry
(74) *Attorney, Agent, or Firm*—Birch, Stewart, Kolasch & Birch, LLP

(57) ABSTRACT

There are disclosed an organic electro luminescence display device that is adaptive for preventing its light emitting efficiency and picture quality from being deteriorated, and a fabricating method thereof.

An organic electro luminescence display device according to an embodiment of the present invention includes an organic electro luminescence array having first and second electrodes formed on a substrate with an organic light emitting layer therebetween, and a barrier rib in parallel to any one of the first and second electrodes; a protective barrier rib formed to be connected to each of the barrier ribs and to enclose the organic electro luminescence array; and at least one dummy barrier rib located at a corner area of the protective barrier rib and connected to the barrier rib and the protective barrier rib.

11 Claims, 11 Drawing Sheets

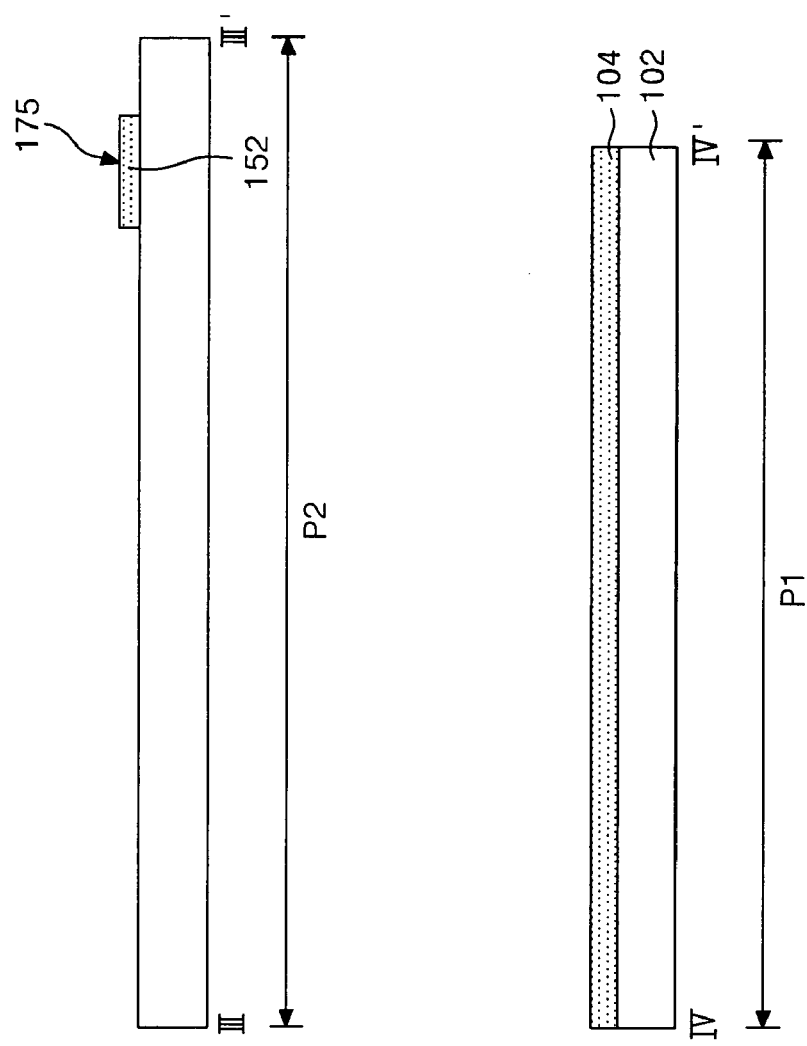

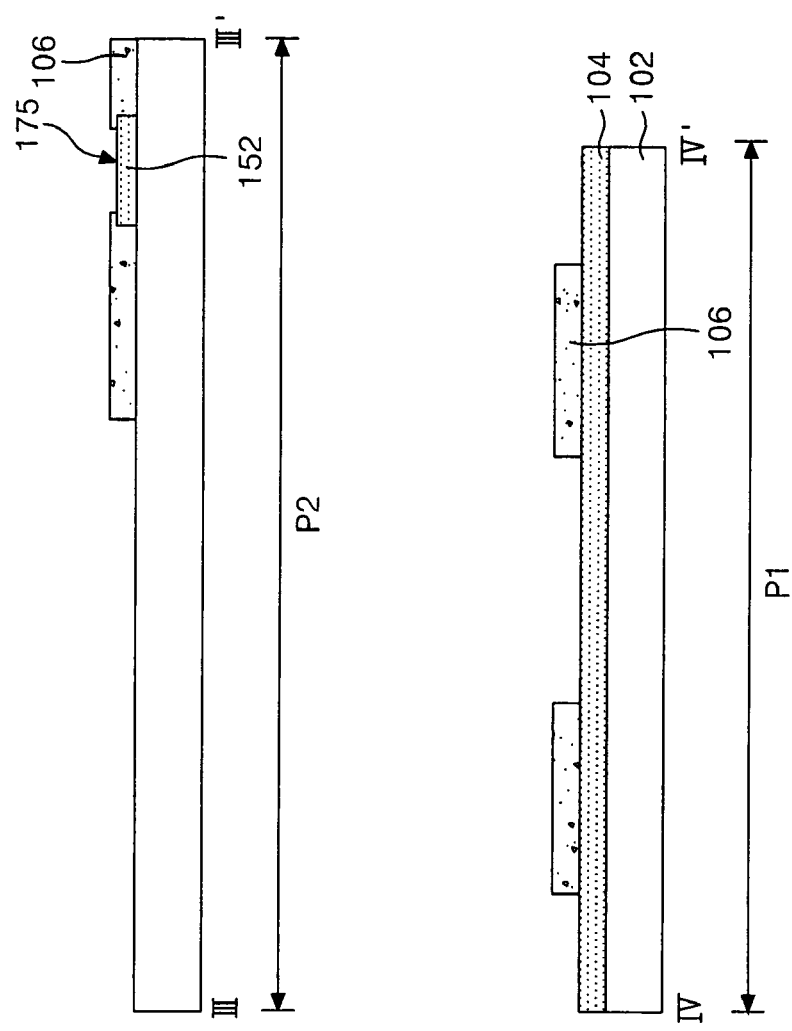

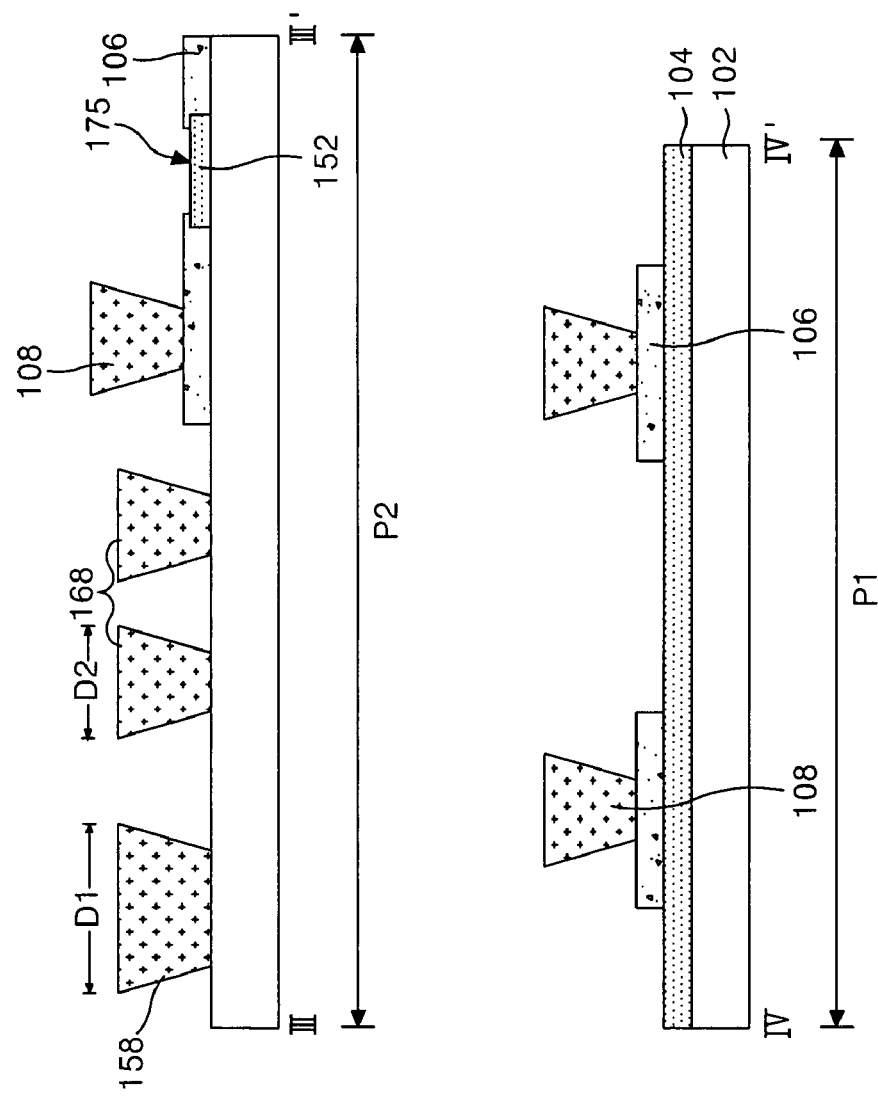

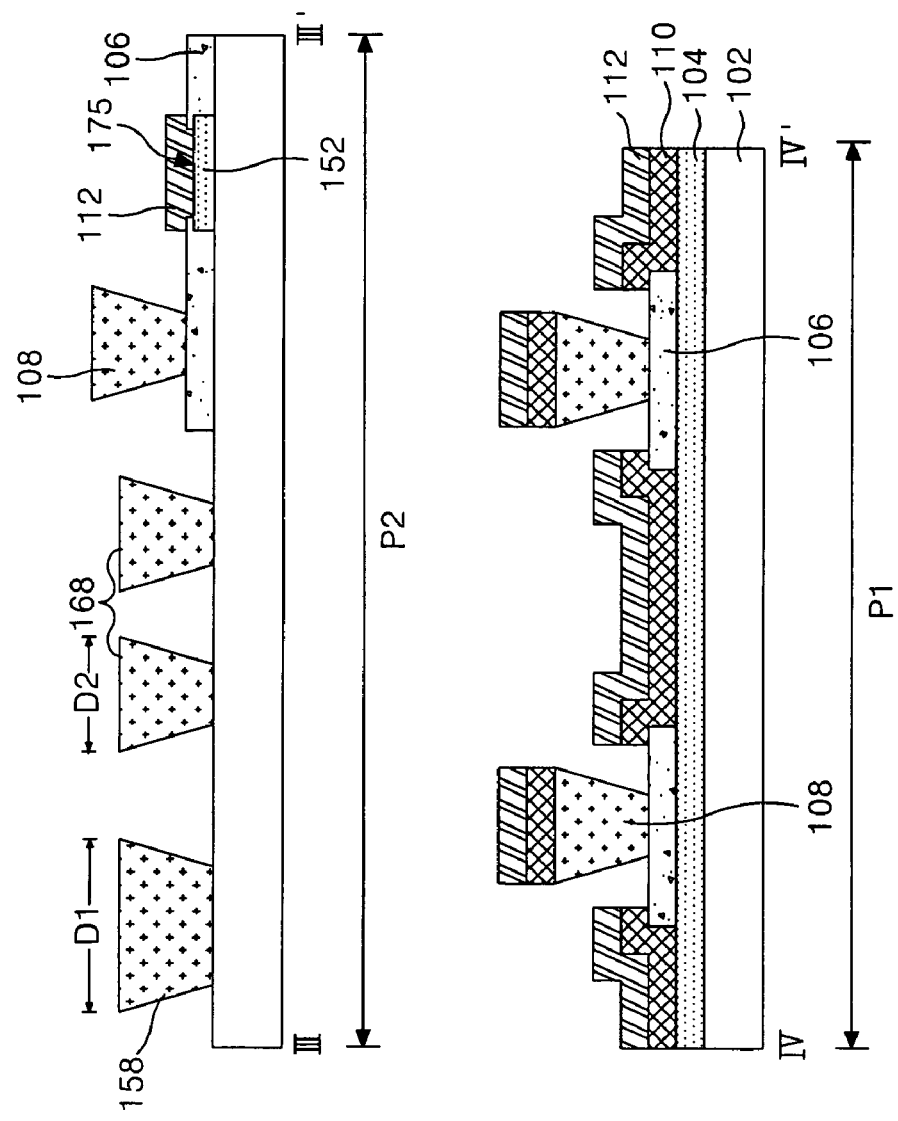

ORGANIC ELECTRO-LUMINESCENCE DISPLAY DEVICE AND FABRICATING METHOD THEREOF

This application claims the benefit of the Korean Patent Application No. P2004-72138 filed on Sep. 9, 2004, which is hereby incorporated by reference.

BACKGROUND OF THE INVENTION

1. Field of the Invention

The present invention relates to an organic electro luminescence display device and a fabricating method thereof, and more particularly to an organic electro luminescence display device that is adaptive for preventing its light emitting efficiency and picture quality from being deteriorated by way of preventing a sealant from flowing into the organic electro luminescence display device, and a fabricating method thereof.

2. Description of the Related Art

Recently, there have been developed a variety of flat panel display devices that can reduce their weight and size, which are a disadvantage of a cathode ray tube CRT. The flat panel display device includes a liquid crystal display LCD, a field emission display FED, a plasma display panel PDP and an electro luminescence EL display device.

Studies for increasing the picture quality and the size of the screen of the flat panel display device have been actively in progress. The EL display device among these is a self-luminous device which emits light by itself. The EL display device excites a phosphorus material by use of a carrier such as electrons and holes, thereby displaying a video image.

The EL display device is largely divided into an inorganic EL display device and an organic EL display device in accordance with a material used.

The organic EL display device is driven with a low voltage of about 5~20V in comparison with the inorganic EL display device which requires a high voltage of 100~200V so that a direct low voltage driving is possible. Further, the organic EL display device has excellent characteristics such as wide viewing angle, high speed response, high contrast ratio and so on, thus the organic EL display device can be used as a pixel of a graphic display and a pixel of a surface light source or of a television image display, and the organic EL display device is a suitable next generation flat panel display because of its thinness and lightness and a good color sense.

FIG. 1 is a diagram briefly representing a general organic EL display device, FIG. 2 is a plane view specifically representing part (A area) of FIG. 1, and FIG. 3 is a sectional diagram illustrating a section of the organic EL display device which is cut along the lines I-I' and II-II' of FIG. 2.

The related art organic El display device shown in FIGS. 1 to 3 includes a display area P1 where there is formed an organic EL array inclusive of a driving electrode, e.g., anode electrode and cathode electrode, and a non-display area P2 where there is located a pad part 25 which supplies driving signals to the driving electrodes of the display area P1.

The organic EL array formed in the display area P1 has an anode electrode 4 formed on a substrate 2 and a cathode electrode 12 formed in a crossing direction to the anode electrode 4.

A plurality of anode electrodes 4 are formed on the substrate 2 to be separated from each other with a designated gap. An insulating film 6 having an aperture part is formed for each EL cell area on the substrate 2 where the anode electrode 4 is formed. Barrier ribs 8 are located on the insulating film 6 for separating an organic light emitting layer 10 and the cathode electrode 12 which are to be formed thereon. The barrier ribs 8 are formed in a direction of crossing the anode electrode 4 and have an overhang structure where an upper end part has a wider width than a lower end part. The organic light emitting layer 10 and the cathode electrode 12 formed of an organic compound are sequentially deposited over the entire surface of the insulating film 6 where the barrier ribs 8 are formed. The organic light emitting layer 10 has a hole injection layer, a hole transport layer, a light emitting layer, an electron transport layer and an electron injection layer deposited and formed on the insulating film 6.

In the non-display area P2, there are formed a first line 54 which is extended from a first electrode (or the anode electrode 4), data pads which supply a data voltage to the anode electrode 4 through the first line 52, a second line 52 which is connected to a second electrode (or the cathode electrode) 12, and a scan pad which supplies a scan voltage through the second line 52. Herein, an opaque conductive layer (not shown) for improving the conductivity of the second line 52 can be further formed on the second line 52. The data pad is connected to a TCP on which a first driving circuit generating the data voltage is mounted, to supply the data voltage to each anode electrode 4. The scan pad is formed at both sides of the data pad. The scan pad is connected to a TCP on which a second driving circuit generating a scan voltage is mounted, to supply the scan voltage to each cathode line 12.

The organic EL array of the display area P1 has a characteristic of being easily deteriorated by moisture and oxygen. In order to solve the problem, an encapsulation process is performed, thereby bonding a cap 28 and the substrate 2, where the organic EL array such as the anode electrode 2 is formed, together through a sealant 25 such as an epoxy resin. A getter for absorbing moisture and oxygen is filled in the center part of the rear surface, thereby protecting the organic EL array from the moisture and the oxygen.

In the related art organic EL display device having such a structure, if a voltage is applied between the anode electrode 4 and the cathode electrode 12 as shown in FIG. 4, an electron (or cathode) generated from the cathode electrode 12 moves toward the light emitting layer 10c through the electron injection layer 10a and the electron transport layer 10b. Further, a hole (or anode) generated from the anode electrode 4 moves toward the light emitting layer 10c through the hole injection layer 10e and the hole transport layer 10d. Accordingly, exitons are formed by a recombination of the electron and the hole which are supplied from the electron transport layer 10b and the hole transport layer 10b. The exitons are excited again to a ground state to emit a light of a fixed energy to the outside through the anode electrode 4, thereby displaying a picture.

On the other hand, in the organic EL display device, it often takes place that the sealant 25 flows into the organic EL array of the display area P1 through a space between the barrier ribs 8 when bonding the gap 28 and the substrate 2 together. The sealant 25 includes a lot of moisture, oxygen and impurities, thereby damaging the organic light emitting layer 10 of the organic EL array. Accordingly, there is a problem in that the light emitting efficiency and picture quality of the device is deteriorated.

SUMMARY OF THE INVENTION

Accordingly, it is an object of the present invention to provide an organic electro luminescence display device that is adaptive for preventing its light emitting efficiency and picture quality from being deteriorated by way of preventing a sealant from flowing into the organic electro luminescence display device, and a fabricating method thereof.

In order to achieve these and other objects of the invention, an organic electro luminescence display device according to an aspect of the present invention includes an organic electro luminescence array having first and second electrodes formed on a substrate with an organic light emitting layer therebetween, and a barrier rib in parallel to any one of the first and second electrodes; a protective barrier rib formed to be connected to each of the barrier ribs and to enclose the organic electro luminescence array; and at least one dummy barrier rib located at a corner area of the protective barrier rib and connected to the barrier rib and the protective barrier rib.

In the organic electro luminescence display device, the protective barrier rib has a relatively wider line width than the barrier rib and the dummy barrier rib.

In the organic electro luminescence display device, the dummy barrier rib includes: a second dummy barrier rib connected to each of the protective barrier rib and the barrier rib to form a designated angle to the protective barrier rib and the barrier rib; and a third dummy barrier rib connected to each of the protective barrier rib and the barrier rib to form a right angle to the barrier rib.

In the organic electro luminescence display device, the line width of the protective barrier rib is about 65~75 μm, and the line width of the barrier rib and the dummy barrier rib is about 10~20 μm.

The organic electro luminescence display device further includes a signal supply pad for supplying a driving signal to the organic electro luminescence array; and a signal line which electrically connects the signal supply pad to any one of the first and second electrodes.

The organic electro luminescence display device further includes an insulating film having a contact hole which exposes the signal line as well as exposing a light emitting area of the first electrode, and wherein any one of the first and second electrodes is connected to the signal line through the contact hole.

A fabricating method of an organic electro luminescence display device according to another aspect of the present invention includes the steps of: forming a first electrode and first and second signal lines on a substrate; forming an insulating film having a contact hole which exposes any one of the first and second signal lines as well as exposing a light emitting area of the first electrode; forming a barrier rib which crosses the first electrode, a protective barrier rib which is connected to each barrier rib and the protective barrier rib encloses the barrier rib, and at least one dummy barrier rib which is connected to the barrier rib and the protective barrier rib, on the substrate where the insulating film is formed; forming an organic light emitting layer in the light emitting area of the first electrode; and forming a second electrode which is parallel to the barrier rib and connected to any one of the first and second signal lines through the contact hole.

In the fabricating method, the protective barrier rib has a relatively wider line width than the barrier rib and the dummy barrier rib.

In the fabricating method, forming the dummy barrier rib includes the step of: forming a second dummy barrier rib which is connected to each of the protective barrier rib and the barrier rib to form a designated angel to the protective barrier rib and the barrier rib, and a third dummy barrier rib which is connected to each of the protective barrier rib and the barrier rib to form a right angel to the barrier rib.

BRIEF DESCRIPTION OF THE DRAWINGS

These and other objects of the invention will be apparent from the following detailed description of the embodiments of the present invention with reference to the accompanying drawings, in which:

FIGS. 7A to 7E are diagrams representing a fabricating method of an organic electro luminescence display device according to an embodiment of the present invention.

DETAILED DESCRIPTION OF THE PREFERRED EMBODIMENT

Reference will now be made in detail to the preferred embodiments of the present invention, examples of which are illustrated in the accompanying drawings.

With reference to FIGS. 5 to 7E, embodiments of the present invention will be explained as follows.

Figure 1:
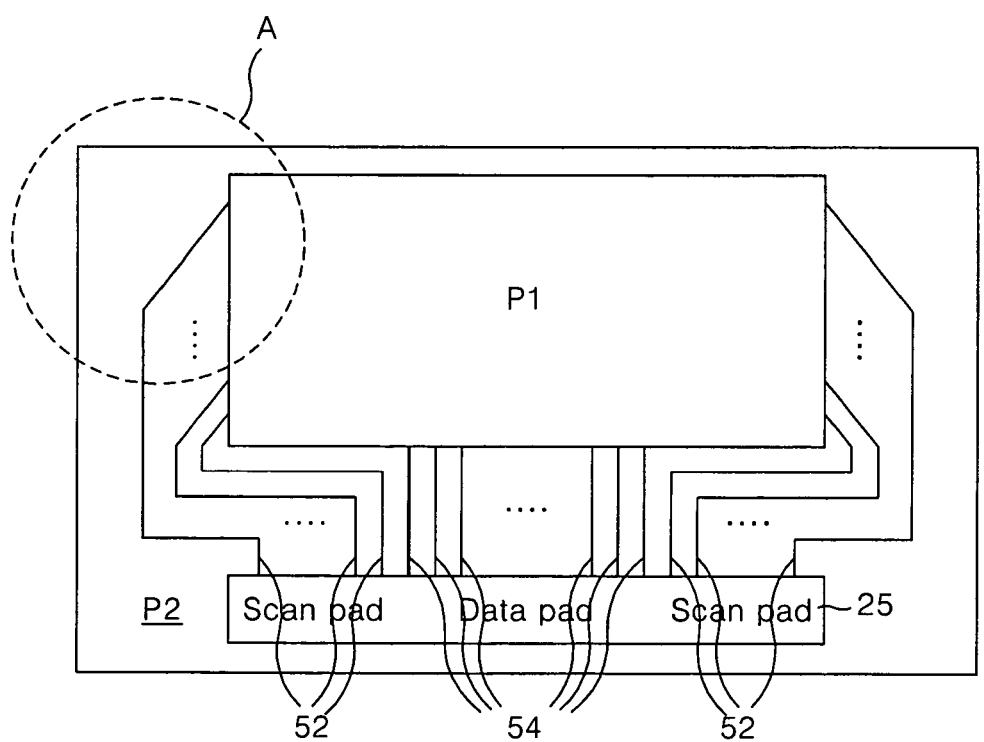
FIG. 1 a plane view briefly illustrating a related art organic electro luminescence display device.
Figure 2:
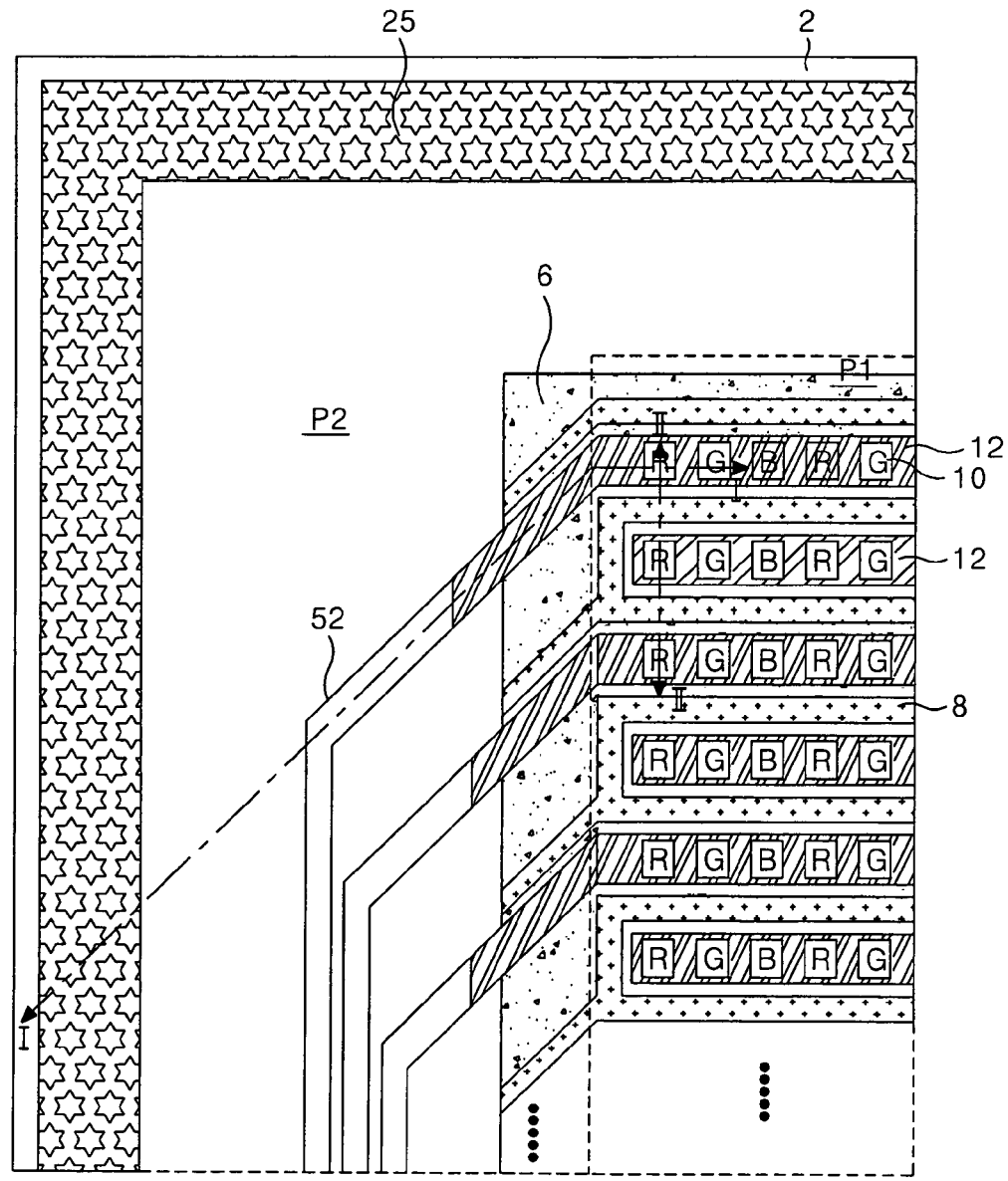
FIG. 2 is a diagram specifically representing an A area of an organic electro luminescence display device shown in FIG. 1.
Figure 3:
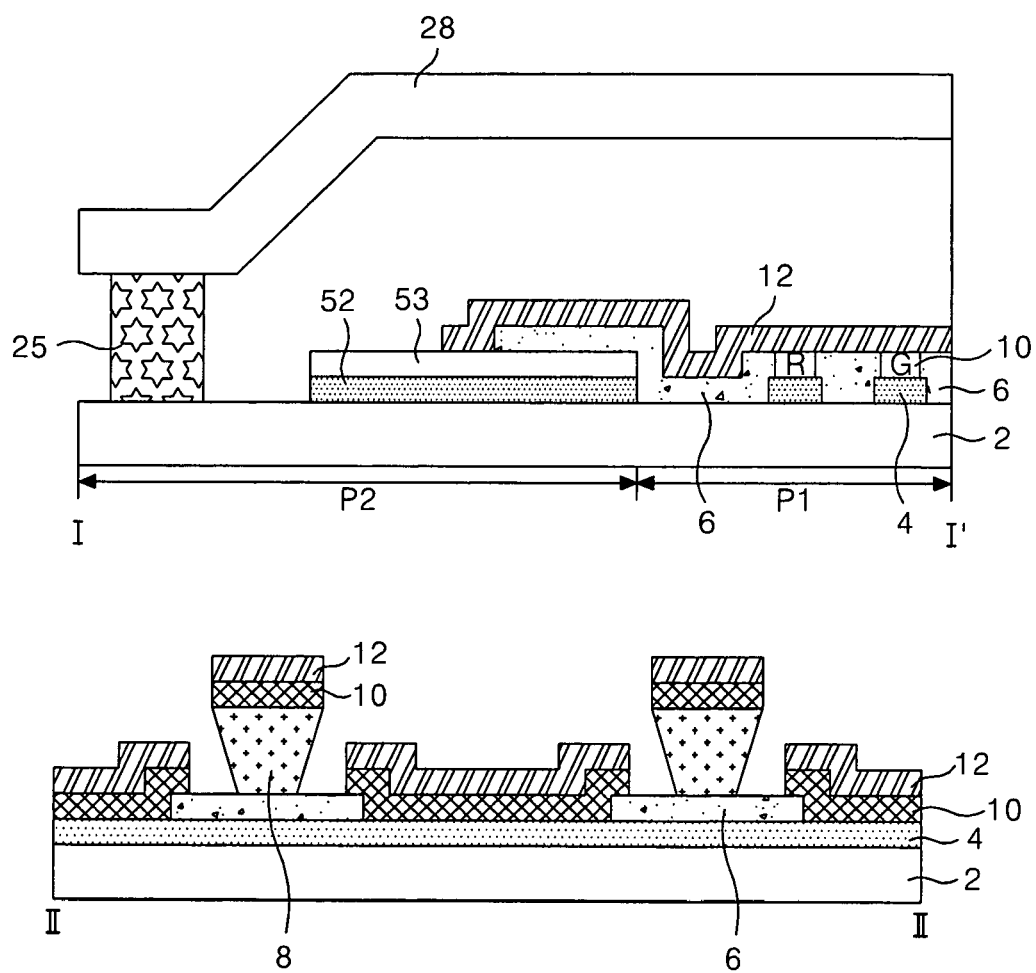
FIG. 3 is a sectional diagram illustrating the organic electro luminescence display device taken along the lines I-I' and II-II' shown in FIG. 2.
Figure 4:
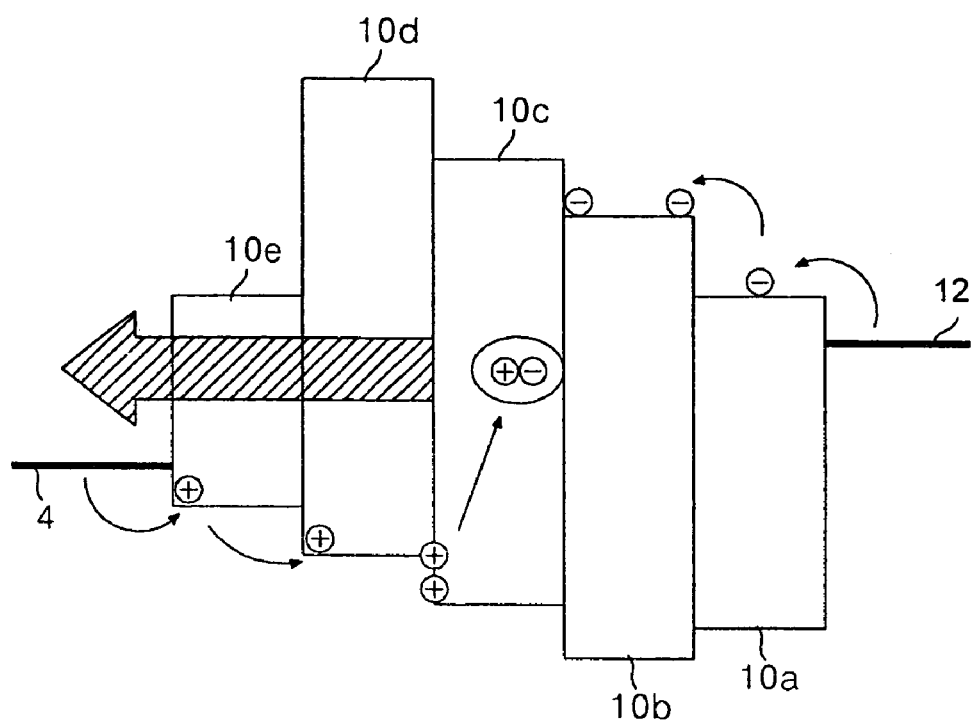
FIG. 4 is a diagram for explaining an light emitting principle of the related art organic electro luminescence display device.
Figure 5:
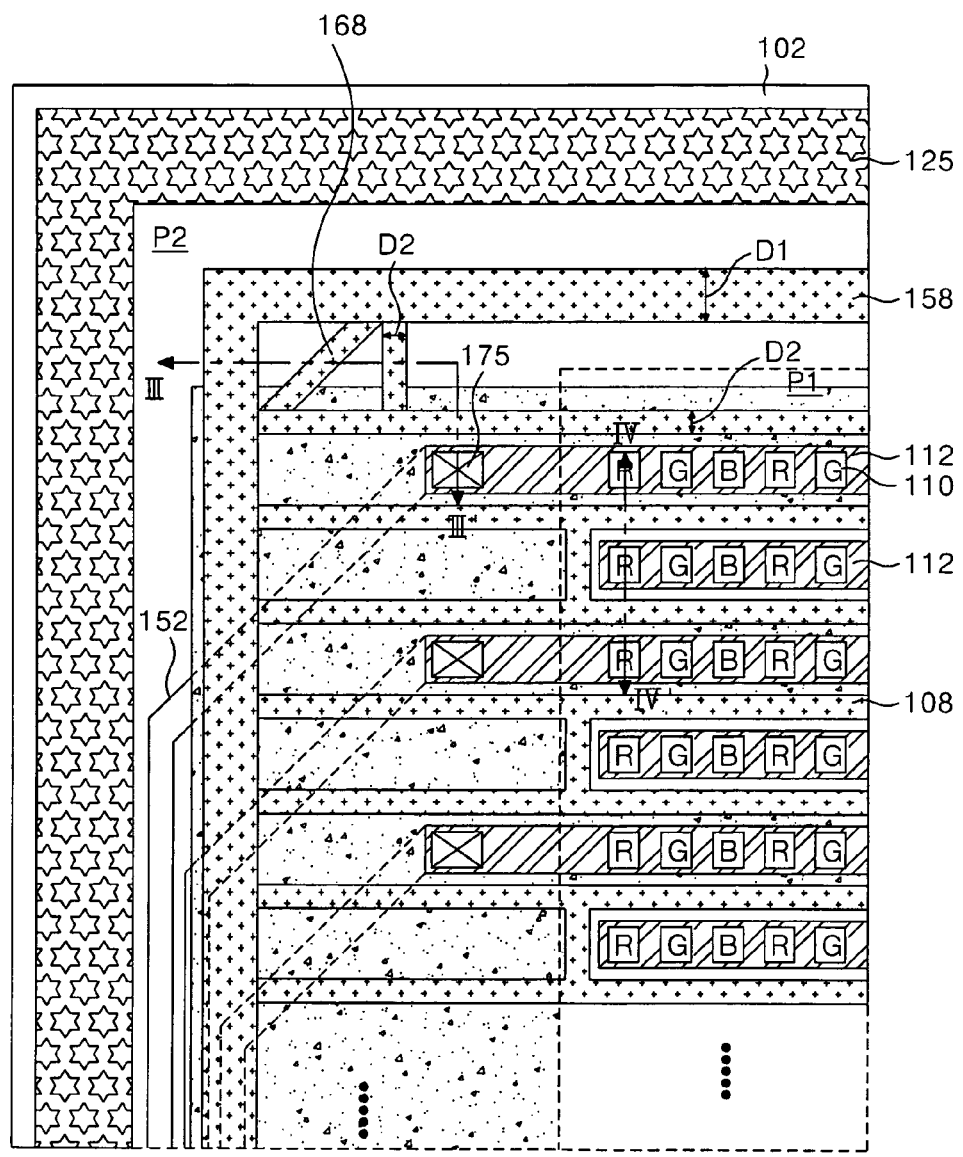
FIG. 5 is a diagram representing part of an organic electro luminescence display device according to an embodiment of the present invention.
Figure 6:
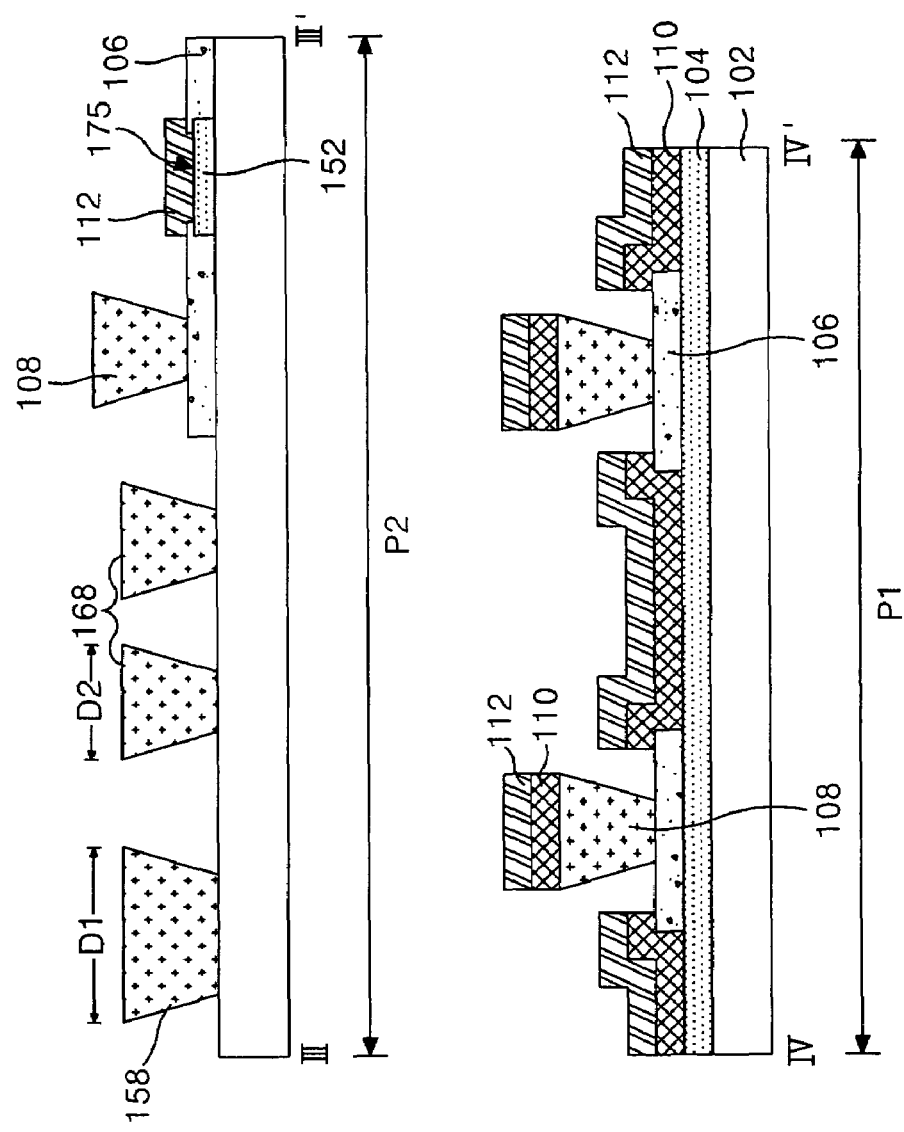
FIG. 6 is a sectional diagram illustrating the organic electro luminescence display device taken along the lines III-III' and IV-IV' shown in FIG. 5.

FIG. 5 is a diagram representing part of an organic EL display device according to an embodiment of the present invention, and FIG. 6 is a sectional diagram illustrating the organic EL display device taken along the lines III-III' and IV-IV' shown in FIG. 5.

The organic EL display device shown in FIGS. 5 and 6 includes a display area P1 where an organic EL array inclusive of an anode electrode and so on is formed, and a non-display area P2 where a pad part supplying driving signals to driving electrodes of the display area P1 is located.

In the display area P1, there is formed the organic EL array which includes an anode electrode 104 formed on a substrate 102 and a cathode electrode 112 formed in a direction of crossing the anode electrode 104.

A plurality of anode electrodes 104 are formed on the substrate 102 to be separated from each other with a designated distance. There is formed an insulating film 106 inclusive of a contact hole 175, which exposes a second line 152 and an aperture part defining a light emitting area for each EL cell area, on the substrate 102 where the anode electrode 104 is formed. On the insulating film 106, there is formed a barrier rib 108 of an overhang structure in which an upper end part has a wider width than a lower end part.

The barrier rib 108 plays the role of separating an organic light emitting layer 110 and a cathode line 112 which are to be formed thereon.

The organic light emitting layer 110 and the cathode electrode 112 formed of an organic compound are sequentially deposited over the entire surface of the insulating film 106 where the barrier rib 108 is formed. The organic light emitting layer 110 has a hole injection layer, a hole transport layer, a light emitting layer, an electron transport layer and an electron injection layer deposited and formed on the insulating film 106.

In a non-display area P2, there are formed a first line (not shown) which is extended from the anode electrode 104 of the display area P1, a data pad which supplies a data voltage to the anode electrode 104 through the first line, a second line 152 which is connected to the cathode electrode 112, and a scan pad which supplies a scan voltage through the second line 152. Herein, the cathode electrode 112 is connected to the second line 152 which is exposed through a contact hole 175 that penetrates the insulating film 106, and an opaque conductive layer (not shown) for improving the conductivity of the second line 152 might be further formed on the second line 152.

The data pad is connected to a TCP on which a first driving circuit generating a data voltage is mounted, to supply the data voltage to each anode electrode 104. The scan pad is formed at both sides of the data pad. The scan pad is connected to the TCP on which a second driving circuit generating a scan voltage is mounted, to supply the scan voltage to each cathode electrode 112.

In the non-display area P2, there is formed a protective barrier rib 158 which is connected to each of the barrier ribs 108 located in the display area P1 and is formed to enclose the display area P1 inclusive of the organic EL array to protect the organic EL array. Further, at least one dummy barrier rib 168 is formed in each corner of the protective barrier rib 158 to be connected to the barrier rib 108 and the protective barrier rib 158. The dummy barrier rib 168 might be formed to be connected to each of the protective barrier rib 158 and the barrier rib 108 while forming a designated angle to them, and the dummy barrier rib 168 might be connected to each of the protective barrier rib 158 and the barrier rib 108 while forming a right angle to the barrier rib 108.

The protective barrier rib 158 and the dummy barrier rib 168 play the role of protecting the organic EL array from a sealant 125 which is used when bonding the substrate 102 and a cap 128.

To describe this more specifically, it is as follows.

The sealant 125 often flows into the organic EL array of the display area P1 when bonding the cap (no shown) and the substrate 102 together. Especially, a relatively more amount of sealant 125 flow into the corner area of the display area P1. At this moment, the protective barrier rib 158 is formed to cover the display area P1, thereby playing the role of preventing the sealant 125 from flowing into the organic EL array. Further, even though a relative large amount of the sealant 125 is concentrated on the corner of the protective barrier rib 158, the sealant 125 is intercepted by the dummy barrier rib 168, thereby protecting the organic EL array from the sealant 125.

Accordingly, the damage of the organic light emitting layer 110 of the organic EL array is prevented, thereby preventing the deterioration of the light emitting efficiency and the picture quality.

Herein, the protective barrier rib 158 has a relatively wider line width than the barrier rib 108 and the dummy barrier rib 168. For example, a line width D1 of the protective barrier rib 158 is about 65~75 µm, and a line width D2 of the barrier rib 108 and the dummy barrier rib 168 is about 10~20 µm.

In this way, the organic electro luminescence display device according to the present invention includes the protective barrier rib 158 which is formed to be connected to each of the barrier rib 108 of the display area P1 and to cover the organic electro luminescence array, and at least one dummy barrier rib 168 which is located at each corner area of the protective barrier rib 158. Accordingly, the organic EL array formed in the display area P1 is covered by the protective barrier rib 158 and a large amount of sealant flowing into the corner of the display area is intercepted by the dummy barrier rib 168, thereby preventing the damage of the organic light emitting layer 110. Hereby, it is possible to prevent the deterioration of the light emitting efficiency and the picture quality.

FIGS. 7A to 7E are diagrams for explaining a fabricating method of an organic EL display device according to the present invention.

Firstly, after depositing a transparent conductive metal material on the substrate 102 which is formed by use of sodalime or hard glass, the transparent conductive metal material is patterned by a photolithography process and an etching process, thereby forming the anode electrode (not shown), the first line (not shown) and the second line 152, as shown in FIG. 7A. Herein, the metal material is indium tin oxide or SnO2. After then, on the second line, there might be formed an opaque conductive layer which might improve the conductivity of the second line 152.

After a photo sensitive insulating material is coated by a spin coating method on the substrate 102 where the anode electrode 104 and the second line 152 are formed, the photo sensitive insulating material is patterned by the photolithography process and the etching process, thereby forming an insulating film 106 having a contact hole 175 which exposes the second line 152 of the non-display area P2 as well as exposing the light emitting area of the display area P1, as shown in FIG. 7B.

After a photo sensitive organic material is deposited on the insulating film 106, the photo sensitive organic material is patterned by the photolithography process and the etching process, thereby forming the barrier rib 108, the protective barrier rib 158 and the dummy barrier rib 168, as shown in FIG. 7C.

The barrier rib 108 is formed in the non-light emitting area of the display area P1 to cross a plurality of anode electrodes 4 for dividing pixels, and the protective barrier rib 158 is formed to be connected to each barrier rib 108 and to cover the display area P1 inclusive of the organic EL array. The dummy barrier rib 168 is formed to be connected to the barrier rib 108 and the protective barrier rib 158 in each corner area of the protective barrier rib 158. Herein, the dummy barrier rib 168 can be formed to be connected to each of the protective barrier rib 158 and the barrier rib 108 while forming a designated angle to the protective barrier rib 158 and the barrier rib 108, and the dummy barrier rib 168 might be connected to each of the protective barrier rib 158 and the barrier rib 108 while forming a right angle to the barrier rib 108.

The protective barrier rib 158 has a relatively wider line width than the barrier rib 108 and the dummy barrier rib 168. For example, a line width D1 of the protective barrier rib 158 is about 65~75 µm, and a line width D2 of the barrier rib 108 and the dummy barrier rib 168 is about 10~20 µm.

Figure 7D:
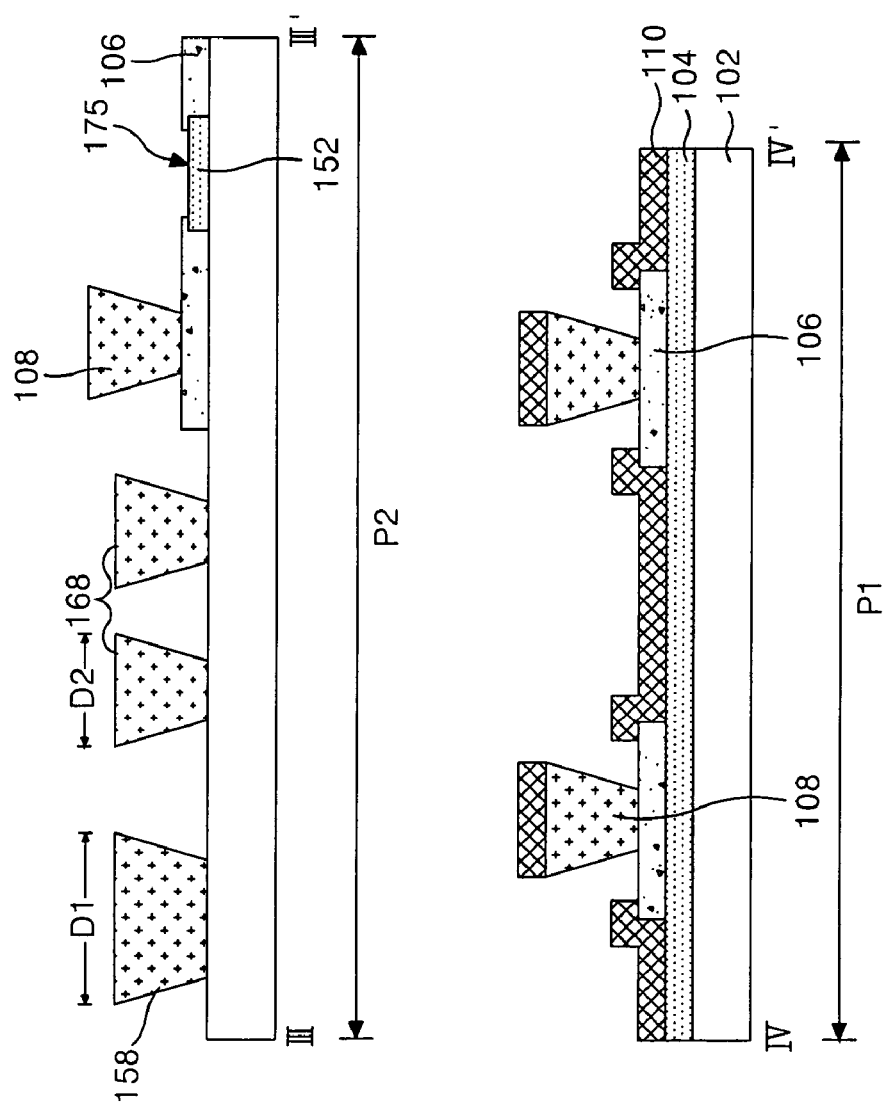

After then, as shown in FIG. 7D, the organic light emitting layer 110 is formed on the light emitting area of the anode electrode 104.

A metal material is deposited on the substrate 102 where the organic light emitting layer 110, thereby forming the cathode electrode 112 to be connected to the second line 152 exposed through the contact hole 175 as well as to be parallel to the barrier rib 108, as shown in FIG. 7E.

As described above, the organic EL display device and the fabricating method thereof according to the present invention has the protective barrier rib formed to cover the organic electro luminescence array and the dummy barrier rib located at each corner area of the protective barrier rib, thereby preventing the damage of the organic light emitting layer caused by the sealant used when bonding the cap and the substrate. Hereby, it is possible to prevent the deterioration of the light emitting efficiency and the picture quality.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. An organic electro luminescence display device having a substrate, a light emitting display area, and a non-display area, comprising:
   an organic electro luminescence array having first and second electrodes formed on the substrate with an organic light emitting layer therebetween;
   a plurality of barrier ribs in parallel to one of the first and second electrodes;
   a protective barrier rib connected to each of the barrier ribs and to enclose the organic electro luminescence light emitting array area; and
   at least one dummy barrier rib located at a corner area of said protective barrier rib and connecting one of said plurality of barrier ribs and said protective barrier rib.

2. The organic electro luminescence display device according to claim 1, wherein the protective barrier rib has a relatively wider line width than the barrier ribs and the dummy barrier rib.

3. The organic electro luminescence display device according to claim 1, wherein the dummy barrier rib comprises: a dummy barrier rib connected to each of the protective barrier rib and one of said plurality of barrier ribs at a designated angle other than at a right angle to the protective barrier rib and said one barrier rib; and a separate dummy barrier rib connected to each of the protective barrier rib and one of the plurality of barrier ribs at a right angle to said one barrier rib.

4. The organic electro luminescence display device according to claim 1, wherein the line width of the protective barrier rib is in a range from about 65 to about 75 microns, and the line width of the one of the plurality of barrier ribs and the dummy barrier rib is in a range from about 10 to about 20 microns.

5. The organic electro luminescence display device according to claim 1, further comprising: a signal supply pad for supplying a driving signal to the organic electro luminescence array; and a signal line which electrically connects the signal supply pad to one of the first and second electrodes.

6. The organic electro luminescence display device according to claim 5, further comprising: an insulating film having a contact hole which exposes the signal line as well as exposing a light emitting area of the first electrode, and wherein one of the first and second electrodes is connected to the signal line through the contact hole.

7. A fabricating method of an organic electro luminescence display device having a substrate, a light emitting display area, and a non-display area, comprising:
   forming a first electrode and first and second signal lines on a substrate;
   forming an insulating film having a contact hole which exposes one of the first and second signal lines as well as exposing a light emitting area of the first electrode;
   forming a plurality of barrier ribs which cross the first electrode;
   forming a protective barrier rib which is connected to said plurality of barrier ribs and encloses said plurality of barrier ribs;
   forming at least one dummy barrier rib connecting at least one of said plurality of barrier ribs to said protective barrier rib, on the substrate where the insulating film is formed;
   forming an organic light emitting layer in a light emitting area of the first electrode; and
   forming a second electrode which is parallel to the plurality of barrier ribs and connected to one of the first and second signal lines through the contact hole.

8. The fabricating method according to claim 7, wherein the protective barrier rib has a relatively wider line width than the barrier ribs and the dummy barrier rib.

9. The fabricating method according to claim 7, wherein the step of forming the dummy barrier rib includes the step of: forming a first dummy barrier rib which is connected to said protective barrier rib and one of the plurality of barrier ribs at a designated angle to said protective barrier rib and said one barrier rib, and a second dummy barrier rib which is connected to said protective barrier rib and one of the plurality of barrier ribs at a right angle to said one barrier rib.

10. An organic electro luminescence display device having a substrate, a light emitting display area, a non-display area, a cap, and a sealant between the substrate and cap to bond the cap to the substrate, comprising:
    an organic electro luminescence array having first and second electrodes formed on the substrate with an organic light emitting layer therebetween;
    a plurality of barrier ribs in parallel to one of the first and second electrodes for separating the first and second electrodes;
    a sealant protective barrier rib connected to each of the barrier ribs and to enclose the organic electro luminescence array, and
    at least one sealant intercepting dummy barrier rib located at a corner area of the protective barrier rib and connecting one of the barrier ribs separating the first and second electrodes and the sealant protective barrier rib.

11. A fabricating method of an organic electro luminescence display device having a substrate, a light emitting display area, a non-display area, a cap, and a sealant between the substrate and cap to bond the cap to the substrate, comprising:
    forming a first electrode and first and second signal lines on a substrate;
    forming an insulating film having a contact hole which exposes one of the first and second signal lines as well as exposing a light emitting area of the first electrode;
    forming a plurality of barrier ribs which crosses the first electrode and separates the first electrode from a second electrode;
    forming a sealant protective barrier rib located between the sealant and the display area which is connected to each barrier rib and encloses the barrier ribs;
    forming at least one sealant intercepting dummy barrier rib connecting one of the barrier ribs and the protective barrier rib, on the substrate where the insulating film is formed;
    forming an organic light emitting layer in a light emitting display area of the first electrode; and
    forming the second electrode which is parallel to the barrier ribs and connected to one of the first and second signal lines through the contact hole.

* * * * *